United States Patent
Hayakawa et al.

Patent Number: 5,168,166
Date of Patent: Dec. 1, 1992

[54] CHARGED PARTICLE BEAM PROJECTION ALIGNER HAVING POSITION DETECTOR USING LIGHT BEAM

[75] Inventors: Hajime Hayakawa, Tokyo; Kazumitsu Nakamura, Katsuta; Hiroyuki Itoh, Tokyo, all of Japan

[73] Assignee: Hitachi, Ltd., Tokyo, Japan

[21] Appl. No.: 708,395

[22] Filed: May 31, 1991

[30] Foreign Application Priority Data

Jun. 1, 1990 [JP] Japan ................... 2-141349

[51] Int. Cl.⁵ ............................................. H01J 37/26
[52] U.S. Cl. ............................... 250/492.2; 250/491.1
[58] Field of Search ............. 250/492.2, 492.22, 491.1, 250/310, 398, 399, 397

[56] References Cited

U.S. PATENT DOCUMENTS

| | | | |
|---|---|---|---|
| 4,440,475 | 4/1984 | Colliaux | 250/310 |
| 4,537,477 | 8/1985 | Takagi et al. | 250/310 |
| 4,990,776 | 2/1991 | Fushimi et al. | 250/310 |

Primary Examiner—Jack I. Berman
Assistant Examiner—Kiet T. Nguyen
Attorney, Agent, or Firm—Antonelli, Terry, Stout & Kraus

[57] ABSTRACT

A charged particle beam projection aligner comprising a particle beam source for irradiating a particle beam, a sectional shape forming device thereof, an electron lens and a deflector, a wafer mounted on a XY table and a vacuum column in which these devices are installed, further comprising an optical device which irradiates a light beam in the same direction as an irradiating direction of the particle beam, a detector for detecting a light beam reflected from alignment marks on the wafer by irradiating the light beam, and for detecting a reflected light beam and a reflected electron beam reflected from a fiducial mark on the XY table by irradiating the light beam and the particle beam, and a computer for memorizing lithographic patterns, correcting said lithographic patterns with signals from the detector and outputting the corrected lithographic patterns to the electron lens and the deflector so as to control them. Since the light beam is irradiated on the wafer in the same direction as the direction of the particle beam, an offset error of the pattern alignment is minimized.

18 Claims, 5 Drawing Sheets

CHARGED PARTICLE BEAM PROJECTION ALIGNER HAVING POSITION DETECTOR USING LIGHT BEAM

BACKGROUND OF THE INVENTION

The present invention relates to a charged particle beam projection aligner having a position detector using a light beam and more particularly to the projection aligner having the position detector which is able to detect marks on a semiconductor wafer such as an IC, LSI, etc., having multi-layers for wiring by using the light beam and align the position of a semiconductor wafer with high accuracy.

When an alignment mark on the semiconductor wafer is clearly exposed on a surface of the wafer, the alignment mark is easily detected by scanning with the charged particle beam which is used for exposing the wafer. But, recently, IC, LSI, etc., devices on the semiconductor wafer are constructed with many wiring layers, and the alignment marks are buried in the wiring layers, making it difficult for the charged particle beam to distinguish the alignment marks buried in the wiring layers from other portions. Therefore, it becomes impossible to detect the alignment mark correctly by scanning the alignment marks with the charged particle beam.

On the other hand, since the light beam easily passes through a transparent portion of the many wiring layers and distinguishes the buried alignment marks from other portions of the wiring layers, the alignment marks are easily detected by scanning with the light beam. For these reasons, the charged particle beam projection aligner generally has the position detector which detects the alignment marks on the semiconductor wafer by using a light beam for aligning the position of the wafer.

The U.S. Pat. No. 4,698,513, the Japanese Patent Laid-Open No. 1-184825 (1989) and the Japanese Utility Model Laid-open No. 1-67733 are cited as examples of such device.

But the conventional technique shown in the above examples has the following drawbacks.

A light projection device for projecting the light beam and the detector for detecting the light beam of the charged particle beam projection aligner are apart from the charged particle beam device and are disposed in a very narrow space between the semiconductor wafer and an objective lens which projects the charged particle beam onto the semiconductor wafer and a fiducial mark on the XY table. Therefore, the light beam is projected with an extremely inclined angle onto the surface of the semiconductor wafer from the light projection device disposed at the side of the objective lens, and it becomes difficult to focus the light beam correctly onto the surface of the semiconductor wafer and XY table and to align the semiconductor wafer with high accuracy (because of a convex and concave surface of the semiconductor wafer and XY table).

SUMMARY OF THE INVENTION

The present invention has been accomplished to overcome the above mentioned problem of the conventional technique.

An object of present invention is to provide a charged particle beam projection aligner having a position detector using a light beam which is perpendicularly irradiated on the semiconductor wafer so as to detect the position of the alignment mark correctly.

In order to attain the object, the light beam is irradiated from the same direction as the particle beam which is perpendicularly irradiated on the semiconductor wafer and should be distinguished from the electron beam at the same time.

Therefore, a mirror having a hole at the center thereof is provided at a focus position of the charged particle beam and the charged particle beam passes through though the hole of the mirror so as to be perpendicularly irradiated on the surface of the wafer. The light beam from the optical source is reflected by the mirror and is perpendicularly irradiated on the alignment mark on the wafer, and it becomes possible to focus the light beam correctly onto the surface of the semiconductor wafer and align the semiconductor wafer with high accuracy in spite of the convex and concave surface of the semiconductor wafer.

Furthermore, another object of the present invention is to provide a charged particle beam projection aligner having a position detector using plural light beams which are irradiated at an angle with respect to the surface of the semiconductor wafer and has a same effect as stated above.

DETAILED DESCRIPTION OF THE PREFERRED EMBODIMENTS

Figure 1:
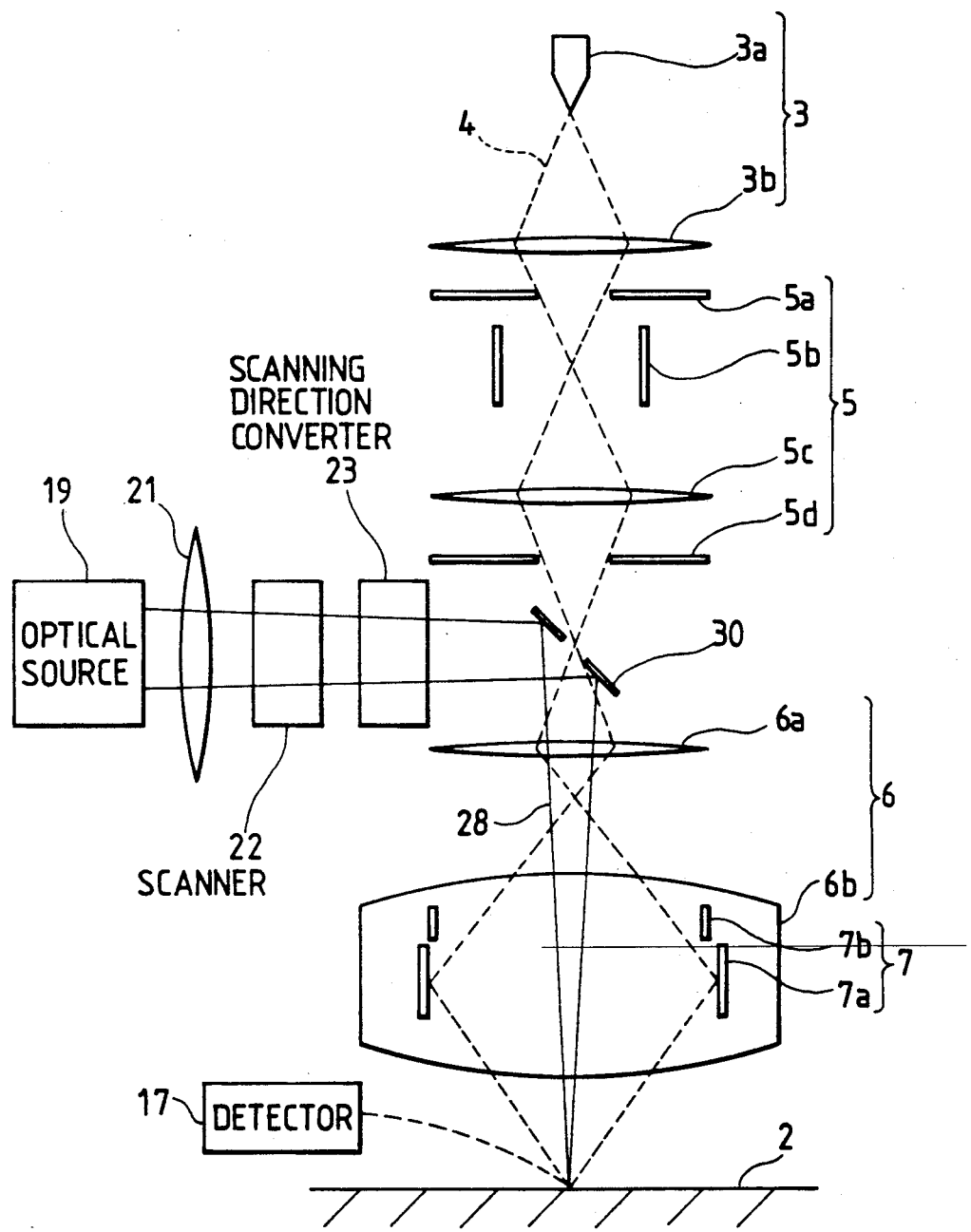
FIG. 1 is a schematic view of an embodiment of the present invention.

FIG. 1 shows a schematic view of an embodiment of a charged particle beam projection aligner having a position detector which is able to detect alignment marks on a wafer and a fiducial mark on an XY table by irradiating a light beam and align the position of a semiconductor wafer according to the present invention.

A charged particle beam source 3 consists of an electron gun 3a and a condenser lens 3b, and a sectional shape forming device 5 of the electron beam 4 consists of a first aperture 5a and second aperture 5d, a shape forming deflector 5b and a shape forming lens 5c. The electron beam 4 irradiated from the electron gun 3a passes through a central hole of a mirror 30 in describing a dotted line as shown in FIG. 1 and further passes through an electron lens 6 which consists of a projecting lens 6a and objective lens 6b, and a deflector 7 which consists of a main-deflector 7b and sub-deflector 7a so as to irradiate the surface of a wafer 2.

On the contrary, a light beam 28 irradiated from an optical source 19 passes through a condenser lens 21, a scanner 22 and a scanning direction converter 23 and is reflected by the mirror 30 so as to irradiate the surface of the wafer 2.

The reflected light beam which is scattered from an irradiated position of the surface of the wafer 2 is detected by a detector 17. Furthermore, the detector 17 also detects a secondary reflected electron beam too when the surface of the wafer 2 is irradiated by the electron beam 4. A general semiconductor optical sensor, image pickup tube, etc. may be used as the detector 17 and if needed, the detectors for the reflected light beam and the reflected electron beam may be installed separately.

As shown in FIG. 1, since the light beam 28 irradiated to the wafer is coaxial to the electron beam 4, the reflected light beam and the reflected electron beam are influenced in the same manner by the detected position error depending on the concave and convex portion of the mark, and the offset error between the mark position signals detected by the reflected light beam and the reflected electron beam can be minimum.

Furthermore, as the detector 17 is disposed between the objective lens 6b and the wafer 2 on the XY table and is close to an irradiated portion of the wafer surface by the light beam, the detector has a merit that the detection effect thereof is high.

The condenser source 19, the optical lens 21, the scanner 22, the scanning direction converter 23, etc., are disposed outside of a vacuum column which is not shown in the figure and in which the electron beam source 3, the sectional shape forming device 5 of the electron beam 4, the electron lens 6, the deflector 7, etc., are installed, whereby a detecting system for detecting the mark by scanning with the light beam 28 is easily installed on the vacuum column without any problem.

The mirror 30 is disposed at the position of a focus point of the electron beam 4, whereby the hole of the mirror 3 can be very small so that the light beam is effectively reflected towards the surface of the wafer 2 without any practical loss of the light beam 28.

The installing angle of the mirror 30 is fixed at an angle of 45° to the axis of the electron beam 4, but the irradiating angle of the light beam relative to the surface of the wafer is easily and finely adjusted by varying the installing angle of the optical system consisting of the condenser source 19, the optical lens 21, the scanner 22, the scanning direction converter 23, etc., which is installed outside of the vacuum column.

Figure 2:
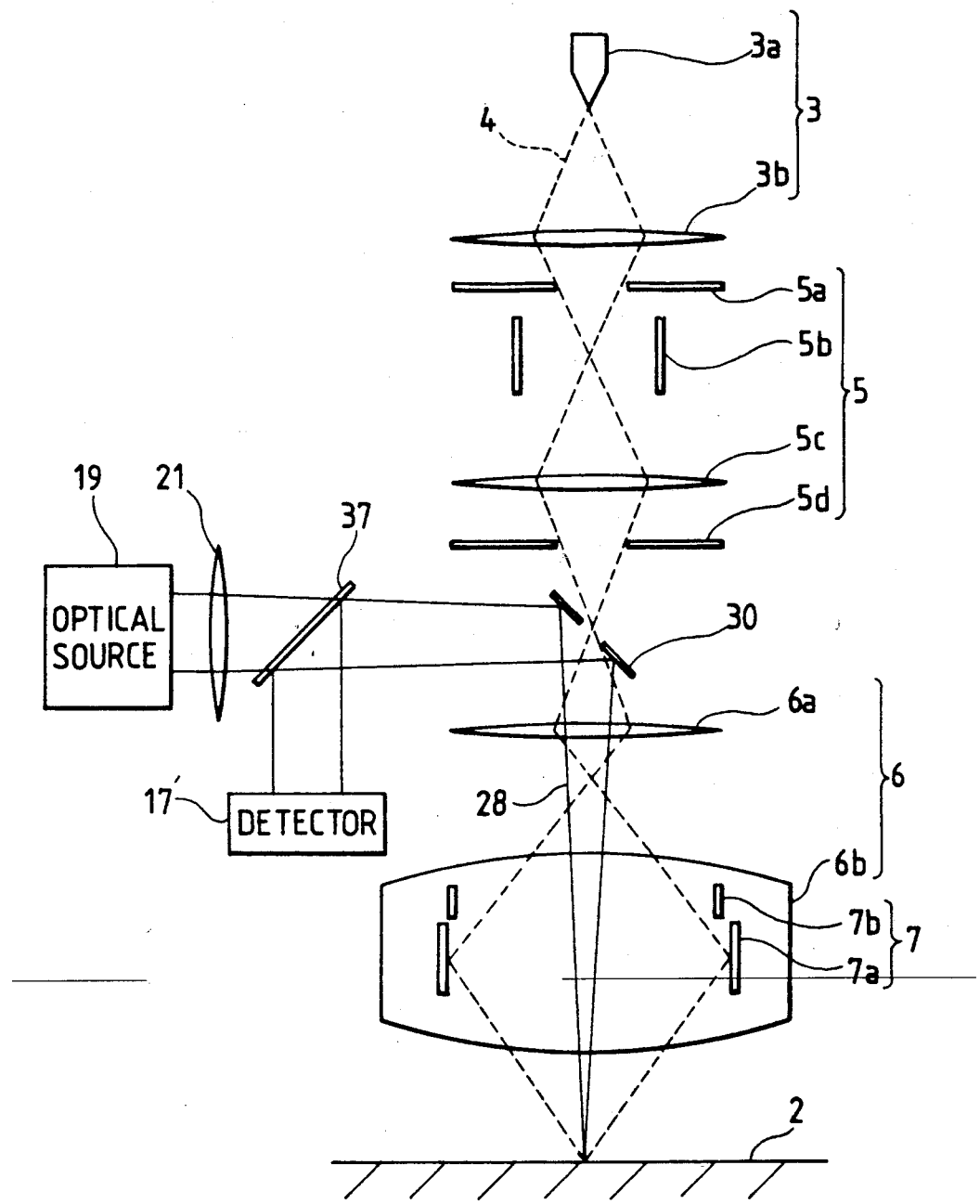
FIGS. 2 and 3 are schematic views of another embodiment of the present invention.

FIG. 2 shows a schematic view of another embodiment of the charged particle beam projection aligner having another type of the optical system according to the present invention.

In FIG. 2, the light beam irradiated from the optical source 19 passes through the optical lens 21 and a half mirror 37 and reflected by the mirror 30 having the hole in the center thereof so as to irradiate the surface of the wafer 2 in the same way as in FIG. 1. The light beam reflected by the surface of the wafer 2 goes back through the objective lens 7 and is reflected by the mirror 30 and the half mirror 37 so as to go back to a detector 17'. The numerals in FIG. 2 which are same as those in FIG. 1 show the same elements as those in FIG. 1.

The detector 17 in FIG. 1 must be disposed in a narrow space between the objective lens 6b and the surface of the wafer 2, but the detector 17' in FIG. 2 has a merit that it is freely disposed in a wide space beside the vacuum column. Therefore, the detector 17' need not to be a small one and thus the detector 17' may be a larger one such as an image pick-up device.

Figure 3:
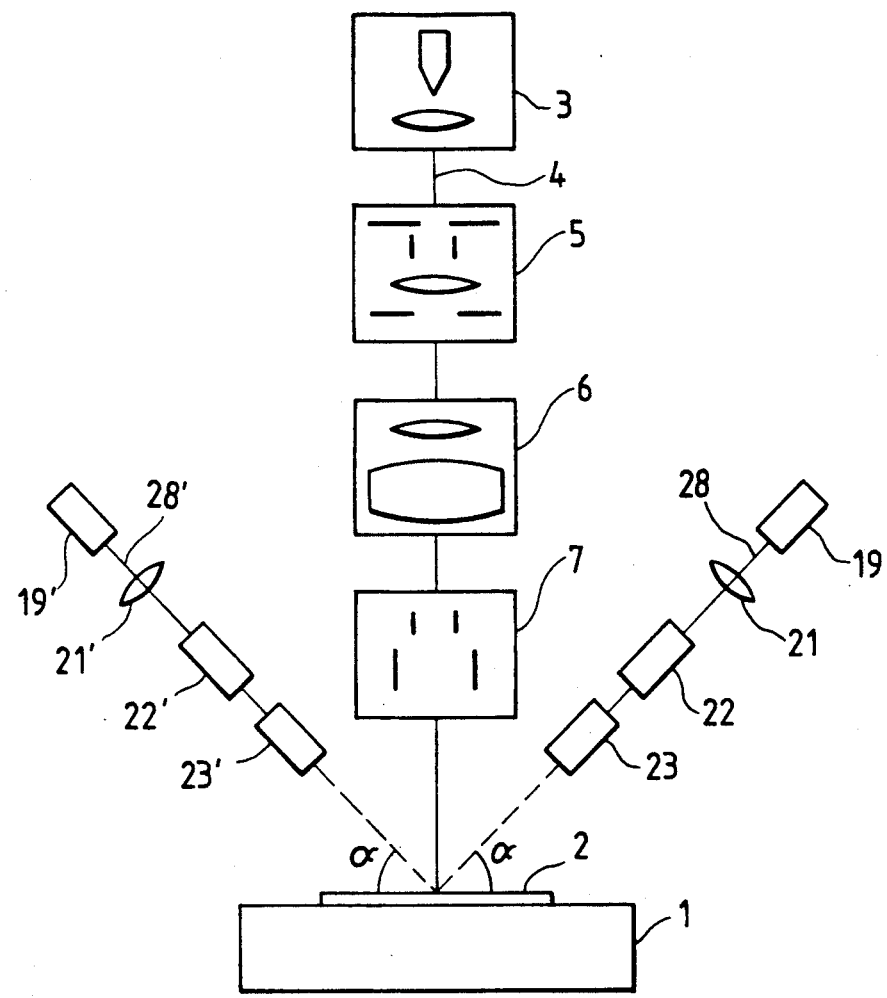

Furthermore, FIG. 3 shows a schematic view of another embodiment of the charged particle beam projection aligner having another type of the optical system according to the present invention. The numerals in FIG. 3 which are same as those in FIG. 1 show the same elements as those in FIG. 1.

The charged particle beam projection aligner shown in FIG. 3 has two sets of the optical systems consisting of the condenser sources 19, 19', the optical lenses 21, 21', the scanners 22, 22', etc. The two light beams 28, 28' from the two optical systems which are disposed at different positions relative to the central axis of the electron beam 4 are irradiated to the same position on the surface of the wafer 2 on the XY stage 1. The inclined angles α of the two beams relative to the surface of the wafer 2 are the same. The position of the alignment marks of the wafer can be calculated from a known angle between the two light beams and the inclined angles α of the light beams and the detected position errors caused by the convex and concave surface of the alignment marks are cancelled by detecting the signals generated by the two optical beams.

Figure 4:
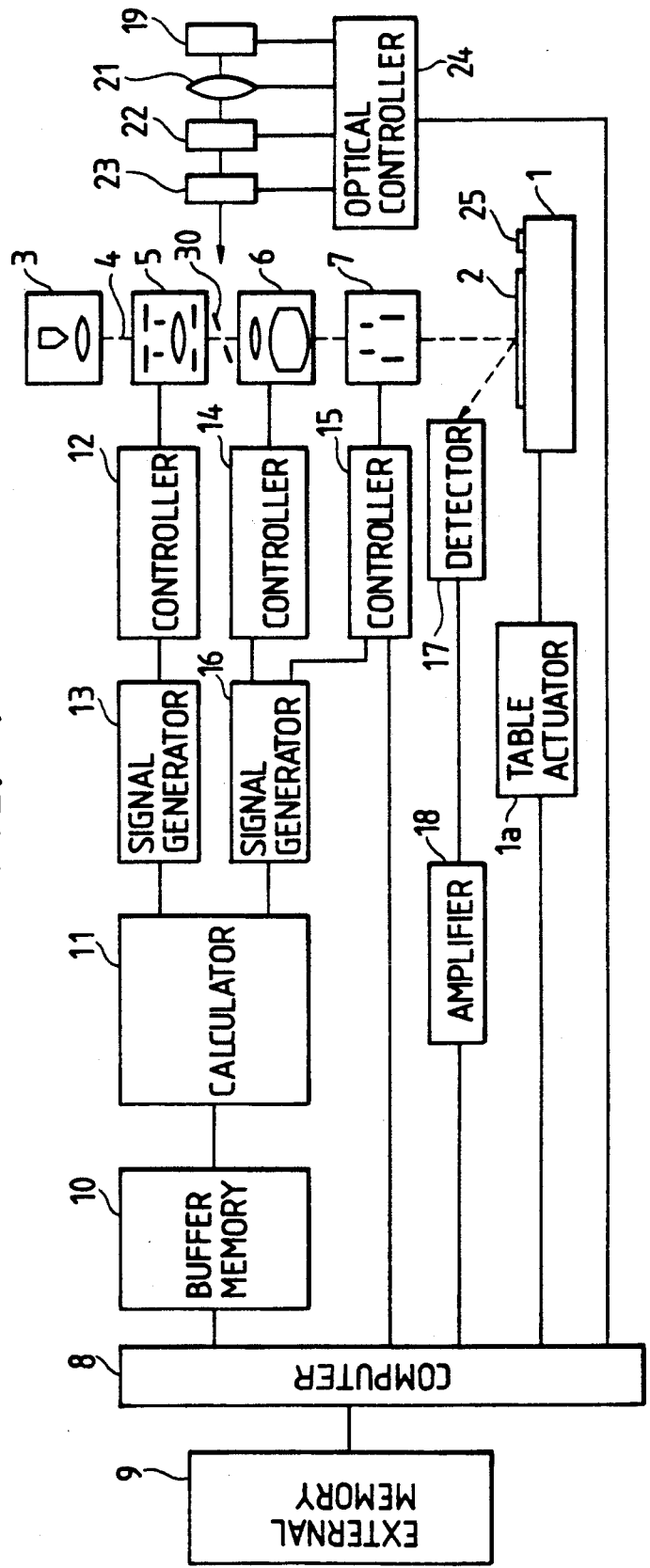
FIG. 4 is a system block diagram of a charged particle beam projection aligner according to the present invention.

The FIG. 4 shows a block diagram of a control system for a charged particle beam projection aligner according to the present invention.

The wafer 2 is mounted on the movable XY table 1, and the charged particle beam source 3, the sectional shape forming device 5, the electron lens 6 and the deflector 7 are disposed as shown in FIG. 1, for example.

In FIG. 4, an external memory 9 memorizes various informations such as integral circuit patterns which are projected on the wafer and the informations are transmitted to a buffer memory 10 by a control computer 8 on occasion. A calculator 11 calculates controlling signals such as irradiating position signals, spot signals etc., of the electron beam 4 or the light beam 28.

A signal generator 13 generates the spot shape signals of the electron beam 4 irradiated on the wafer 2 based on the controlling signals from the calculator 11 and outputs them to the sectional shape forming device 5 through a controller 12 so as to control the sectional shape forming device 5. In the same way, a signal generator 16 generates the irradiating position signals of the electron beam 4 based on the controlling signals from the calculator 11 and outputs them to the electron lens 6 and the deflector 7 respectively through the controllers 14 and 15 so as to control the electron lens 6 and the deflector 7.

The light beam 28 is irradiated on the surface on the wafer 2 by an optical system consisting of the optical source 19, the condenser lens 21, scanner 22, the scanning direction converter 23 and the mirror 30 and an optical controller 24 controls the optical source 19, the condenser lens 21, the scanner 22, the scanning direction converter 23 based on signals from the computer 8.

According to the controls of the various controllers 12, 14, 15 and the scanning direction converter 23 as stated above, the electron beam 4 and the light beam 28 are irradiated onto the marks on the wafer 2 and the fiducial mark 25 on the XY table 1. The XY table 1 is actuated by a table actuator 1a based on signals from the computer 8.

The reflected light beam and the reflected electron beam or secondary electrons reflected from the marks on the wafer 2 and the fiducial mark 25 on the XY table are detected by the detector 17 and are fed back to the computer 8 through a mark signal amplifier 18 and are compared with position signals of the light beam and the electron beam memorized in the computer 8 so as to compensate the position signals of the light beam and the electron beam as follows.

First offset values between irradiation position signals of the electron beam 4 and the light beam 28 are detected by irradiating the fiducial mark 25 on the XY table 1 with the electron beam 4 and the light beam 28. The fiducial mark is used for detecting the offset valves because the electron beam 4 may miss detecting the mark on the wafer. From this reason, the XY table 1 is moved to a predetermined position according to the position signal of the fiducial mark from the computer 8, and then the electron beam 4 scans the fiducial mark 25 in two directions X and Y and coordinates $(X_{T1}, Y_{T1})$ of the fiducial mark 25 are calculated by detecting the secondary electrons scattered from the fiducial mark 25. In the same way, the light beam 28 scans the fiducial mark 25 in two directions X and Y and coordinates $(X_{T2}, Y_{T2})$ of the fiducial mark 25 are calculated by detecting the reflected light from the fiducial mark 25.

The offset values between the electron beam and the light beam are obtained from the following equations:

$$\text{Offset value for X coordinate} = (X_{T1} - X_{T2}) \quad (1)$$

$$\text{Offset value for Y coordinate} = (Y_{T1} - Y_{T2}) \quad (2)$$

These offset values are memorized in, for example, the buffer memory 10.

Next, a positional relation between the XY table 1 and the wafer 2 thereon is measured. The XY table 1 is moved so as to set an alignment mark W (herein after called mark W) (see FIG. 5) on the wafer 2 in an irradiating area of the light beam 28 and coordinates of the mark W are obtained by detecting the reflected light beam. As the electron beam is not always able to detect the mark W on the wafer 2 clearly, the light beam 28 is used. And further, the measurement of plural marks W is performed in order to align the whole position of the wafer 2.

Figure 5:
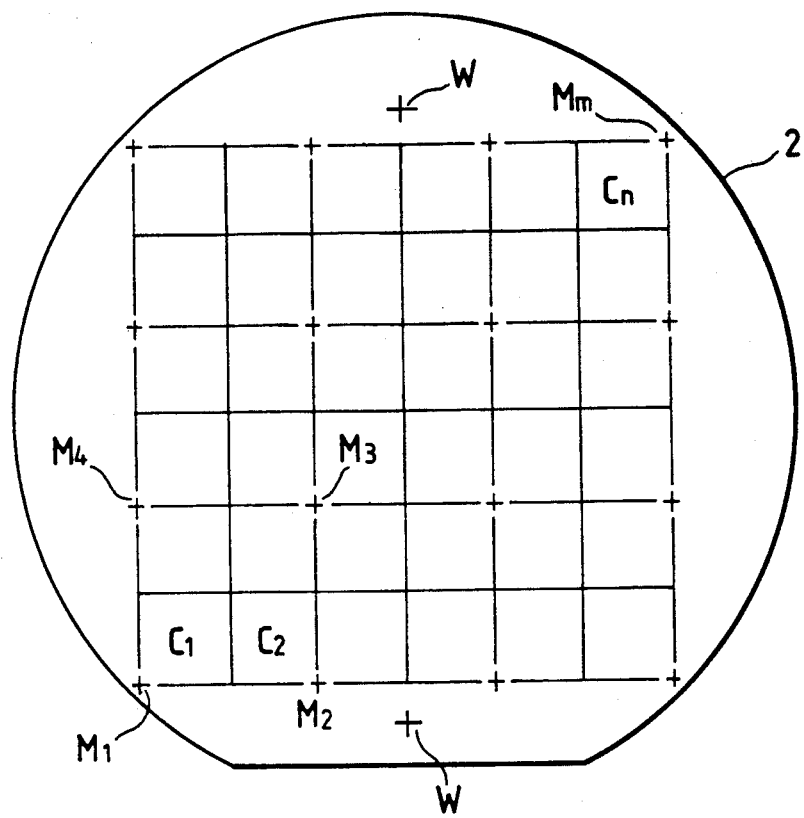
FIG. 5 is a schematic view of alignment marks on the semiconductor wafer.

Then, the alignment of the each element block in the wafer 2 is performed. As shown in FIG. 5, the surface of the wafer 2 is divided into many element blocks $C_1$, $C_2$-$C_n$ which are individual integrated circuits and the alignment marks M are respectively provided at boundaries of plural element blocks. For example, at the four corners of the four element block including the blocks $C_1$, $C_2$, element block marks $M_1$-$M_4$ are provided and the alignment of the element blocks $C_1$, $C_2$ are performed by detecting the marks $M_1$-$M_4$.

For example, the XY table is moved so as to align the element block mark $M_1$ in the irradiating area of the light beam 28 and the coordinates $(X_{M1}, Y_{M1})$ are obtained, and in the way, the coordinates $(X_{M2}, Y_{M2})$-$(X_{M4}, Y_{M4})$ of the element block marks $M_2$-$M_4$, etc., are obtained.

As stated above, the positions of the element blocks are calculated, and furthermore, as the wafer 2 is usually deformed a little because of the elongation or the torsion thereof, the positional distortion of the blocks are amended by using the coordinates of the four element block marks at the corners of the block as generally known.

Figure 6A:
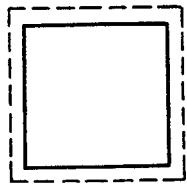
FIGS. 6(a), 6(b) and 6(c) are schematic views of various block patterns on the wafer.
Figure 6B:
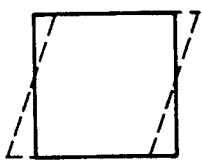
Figure 6C:
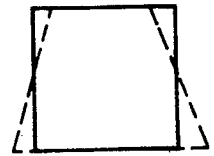

FIGS. 6(a), 6(b), 6(c) show examples of the deformation of the element block of the wafer 2. Continuous lines in the Figures show correct forms of the element blocks and the dotted lines show distorted forms. FIG. 6(a) shows a deformation where the element block is elongated equally in a vertical direction and a horizontal direction. FIG. 6(b) shows a deformation where the element block is leaned and FIG. 6(c) shows a deformation where the element block forms a trapezoid. Practical deformation is combined with these deformations as stated above.

The computer 8 calculates correction coefficients $A_X$, $A_Y$ corresponding to the elongations of the element block, correction coefficients $B_X$, $B_Y$ corresponding to the lean of the element block and correction coefficients $C_X$, $C_Y$ corresponding to the trapezoid deformation by comparing the coordinates calculated from the detected four element block marks which are shown with the dotted line of Figs. 6(a), 6(b), 6(c) with the correct coordinates memorized in the computer which are shown by the continuous lines in FIGS. 6(a), 6(b) 6(c). Using the correction coefficients $A_X$, $A_Y$, $B_X$, $B_Y$, $C_X$, $C_Y$ and the offset values shown in the equations (1), (2), the coordinates $(X_P, Y_P)$ of the integrated circuit patterns memorized in the external memory 9 are corrected based on the following equations:

$$X_1 = (1 + A_X)X_P + B_X Y_P + C_X X_p Y_p + (X_{T1} - X_{T2}) \quad (3)$$

$$Y_1 = (1 + A_Y)Y_p + B_Y X_p + C_y X_p Y_p + (Y_{T1} - Y_{T2}) \quad (4)$$

The electron beam 4 is aligned based on the corrected coordinates $(X_i, Y_i)$ and correct lithography patterns are produced on the wafer without any offset and distortion.

In the present invention, since both the light beam and the electron beam may be irradiated on the wafer perpendicularly and from the same direction, the detected positional errors of the marks caused by the convex and concave thereof are minimized.

Furthermore, both the reflected light beam and the reflected electron beam may be detected from the same direction and the detected positional error is minimized further.

When the light beam and the electron beam are not irradiated from the same direction, plural light beams are irradiated from plural light sources at inclined angles relative to the surface of the wafer 2, the reflected light beams from the wafer 2 are compared with each other, and the detected positional error is minimized in the same way.

We claim:

1. A charged particle beam projection aligner comprising a particle beam source for irradiating a particle beam, a sectional shape forming device of the particle beam, an electron lens and a deflector which converge the particle beam on a predetermined position of a wafer mounted on an XY table and a vacuum column in which the particle beam source, the sectional shape forming device, the electron lens and the deflector are installed, further comprising:

an optical device which irradiates a light beam in the same direction as an irradiating direction of the particle beam, a detector for detecting signals which are reflected from alignment marks on the wafer by irradiating the light beam thereon and from a fiducial mark on the XY table by irradiating the light beam and the particle beam thereon, and a computer for memorizing lithographic patterns, correcting said lithographic patterns with signals from the detector and outputting the corrected lithographic patterns to the electron lens and the deflector so as to control them based on the corrected lithographic patterns.

2. A charged particle beam projection aligner defined in claim 1, characterized by comprising
a mirror for reflecting the light beam which has a hole and is disposed inside of the vacuum column, wherein the particle beam passes through the hole on the wafer.

3. A charged particle beam projection aligner defined in claim 2, characterized in that
the particle beam passes through the hole of the mirror at the focus point of the particle beam.

4. A charged particle beam projection aligner defined in claim 1, characterized by comprising
a window equipped on the side of the vacuum column through which the light beam is transmitted to the mirror.

5. A charged particle beam projection aligner defined in claim 1, characterized in that
the sectional shape forming device of the particle beam is controlled based on the corrected lithographic patterns.

6. A charged particle beam projection aligner defined in claim 1, characterized in that
the detector is installed outside of the column and detects the light beam which is reflected by the mirror and passes through a window equipped at the side of the column after being reflected by the wafer.

7. A charged particle beam projection aligner defined in claim 1, characterized in that
the particle beam and the light beam are perpendicularly converged on the surface of the wafer.

8. A charged particle beam projection aligner defined in claim 1, characterized in that
the direction of the detected signal detected by irradiating the light beam on the wafer is the same as that detected by irradiating the particle beam.

9. A charged particle beam projection aligner defined in claim 1, characterized in that
the detector is installed on the XY table.

10. A charged particle beam projection aligner comprising a particle beam source for irradiating a particle beam, a sectional shape forming device of the particle beam, an electron lens and a deflector which converge the particle beam on a predetermined position of a wafer mounted on an XY table and a vacuum column in which the particle beam source, the sectional shape forming device, the electron lens and the deflector are installed, further comprising;
an optical device which irradiates plural light beams at the same angle relative to the surface of the wafer from different directions,
a detector for detecting signals which are reflected from alignment marks on the wafer by converging the plural light beams thereon and from a fiducial mark on the XY table by irradiating the light beam and the particle beam thereon, and
a computer for memorizing lithographic patterns, correcting said lithographic patterns with signals from the detector and outputting the corrected lithographic patterns to the electron lens and the deflector so as to control them based on the corrected lithographic patterns.

11. A charged particle beam projection aligner for aligning a charged particle beam relative to a wafer mounted on an XY table, the wafer having at least one alignment mark formed thereon and the XY table having a fiducial mark formed thereon, the charged particle beam projection aligner comprising:

means for irradiating the wafer and the XY table with a charged particle beams;
means for focusing the charged particle beam on the wafer and the XY table in response to a focusing signal, and deflecting the charged particle beam to a desired position on the wafer and the XY table in response to a deflection signal;
means for irradiating the wafer and the XY table with a light beam such that an irradiating direction of the light beam relative to the wafer and the XY table is the same as an irradiating direction of the charged particle beam relative to the wafer and the XY table when the charged particle beam is not deflected by the focusing and deflecting means;
means for detecting a reflected charged particle beam reflected from the fiducial mark on the XY table when the charged particle beam is irradiated on the XY table to produce a first output signal, detecting a first reflected light beam reflected from the fiducial mark on the XY table when the light beam is irradiated on the XY table to produce a second output signal, and detecting a second reflected light beam reflected from the at least one alignment mark on the wafer when the light beam is irradiated on the wafer to produce a third output signal; and
means for storing lithographic patterns, reading out the stored lithographic patterns, correcting the read-out lithographic patterns on the basis of the first, second, and third output signals of the detecting means, producing the focusing signal and the deflection signal on the basis of the corrected lithographic patterns, and outputting the focusing signal and the deflection signal to the focusing and deflecting means.

12. A charged particle beam projection aligner according to claim 11, wherein the detecting means includes a detector for detecting the reflected charged particle beam, the first reflected light beam, and the second reflected light beam to produce the first, second, and third output signals.

13. A charged particle beam projection aligner according to claim 12, wherein the detector is disposed between the focusing and deflecting means and the XY table.

14. A charged particle beam projection aligner according to claim 11, wherein the detecting means includes a first detector for detecting the reflected charged particles beam to produce the first output signal, and a second detector for detecting the first reflected light beam and the second reflected light beam to produce the second and third output signals.

15. A charged particle beam projection aligner according to claim 14, wherein the first detector and the second detector are disposed between the focusing and deflecting means and the XY table.

16. A charged particle beam projection aligner according to claim 14, wherein the first detector is disposed between the focusing and deflecting means and the XY table, and the second detector is not disposed between the focusing and deflecting means and the XY table.

17. A charged particle beam projection aligner for aligning a charged particle beam relative to a wafer mounted on an XY table, the wafer having at least one alignment mark formed thereon and the XY table having a fiducial mark formed thereon, the charged particle beam projection aligner comprising:

means for irradiating the wafer and the XY table with a charged particle beam;

means for focusing the charged particle beam on the wafer and the XY table in response to a focusing signal, and deflecting the charged particle beam to a desired position on the wafer and the XY table in response to a deflection signal;

means for irradiating the wafer and the XY table from a plurality of mutually different directions with a plurality of light beams such that the plurality of light beams are incident on one point on the wafer and the XY table at a same incident angle relative to the wafer and the XY table;

means for detecting a reflected charged particle beam reflected from the fiducial mark on the XY table when the charged particle beam is irradiated on the XY table to produce a first output signal, detecting first reflected light reflected from the fiducial mark on the XY table when the plurality of light beams are irradiated on the XY table to produce a second output signal, and detecting second reflected light reflected from the at least one alignment mark on the wafer when the plurality of light beams are irradiated on the wafer to produce a third output signal; and means for storing lithographic patterns, reading out the stored lithographic patterns, correcting the read-out lithographic patterns on the basis of the first, second, and third output signals of the detecting means, producing the focusing signal and the deflection signal on the basis of the corrected lithographic patterns, and outputting the focusing signal and the deflection signal to the focusing and deflecting means.

18. A charged particle beam projection aligner according to claim 17, wherein the detecting means includes at least one detector disposed between the focusing and deflecting means and the XY table for detecting the reflected charged particle beam, the first reflected light, and the second reflected light to produce the first, second, and the third output signals.

* * * * *